United States Patent
Hase et al.

(10) Patent No.: US 6,207,550 B1
(45) Date of Patent: *Mar. 27, 2001

(54) METHOD FOR FABRICATING BUMP ELECTRODES WITH A LEVELING STEP FOR UNIFORM HEIGHTS

(75) Inventors: Nobuhiro Hase, Neyagawa; Minehiro Itagaki, Moriguchi; Yoshifumi Nakamura, Neyagawa; Satoru Yuhaku, Osaka; Hiroaki Takezawa, Katano; Yoshihiro Bessho, Higashiosaka, all of (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/107,319

(22) Filed: Jun. 30, 1998

(30) Foreign Application Priority Data

Jul. 2, 1997 (JP) .................................................... 9-176844

(51) Int. Cl.[7] .................................................... H01L 21/44
(52) U.S. Cl. .................... 438/613; 438/118; 438/119; 438/667
(58) Field of Search .................................. 438/613, 614, 438/119, 118, 667, 975, FOR 343, 403, 108; 257/737, 738, 772, 773, 778, 780; 228/179.1, 180.22

(56) References Cited

U.S. PATENT DOCUMENTS

| | | | |
|---|---|---|---|
| 5,136,365 | * 8/1992 | Pennisi et al. | 257/783 |
| 5,196,371 | * 3/1993 | Kulesza et al. | 438/614 |
| 5,384,952 | * 1/1995 | Matsui | 29/840 |
| 5,516,032 | * 5/1996 | Sakemi et al. | 257/778 |
| 5,545,589 | * 8/1996 | Tomura et al. | 438/613 |
| 5,550,408 | * 8/1996 | Kunitomo et al. | 257/737 |
| 5,587,342 | * 12/1996 | Lin et al. | 438/613 |
| 5,670,826 | * 9/1997 | Bessho et al. | 257/737 |
| 5,804,876 | * 9/1998 | Lake et al. | 257/737 |
| 5,844,320 | * 12/1998 | Ono et al. | 257/778 |
| 5,897,337 | * 4/1999 | Kata et al. | 438/114 |
| 6,114,187 | * 9/2000 | Hayes | 438/106 |

FOREIGN PATENT DOCUMENTS

| | | |
|---|---|---|
| 55-13986 | 1/1980 | (JP) . |
| 63-304587 | 12/1988 | (JP) . |
| 5-218133 | 8/1993 | (JP) . |
| 8-78475 | 3/1996 | (JP) . |

\* cited by examiner

*Primary Examiner*—Olik Chaudhuri
*Assistant Examiner*—Alonzo Chambliss
(74) *Attorney, Agent, or Firm*—Wenderoth, Lind & Ponack L.L.P.

(57) ABSTRACT

Disclosed is a method for mounting a semiconductor element, the method requiring no strict flatness for a substrate and being reliable in a semiconductor device produced by mounting a semiconductor element on a circuit substrate. In the multilayer circuit substrate comprising bump electrodes formed of a conductive paste, a conductive adhesive is applied to the top of bump electrodes and then leveled to obtain the end portions on the bump electrodes with a high coplanarity in height. The semiconductor element is mounted on this substrate using a combination of a conductive resin and a sealing resin or an anisotropic conductive sheet. Every top of the bump electrodes after the conductive adhesive is applied has a high coplanarity. The semiconductor element can be mounted with high reliability, on the substrate having such a poor flatness of the electrode face that mounting by a conventional method can not be applied.

6 Claims, 3 Drawing Sheets

METHOD FOR FABRICATING BUMP ELECTRODES WITH A LEVELING STEP FOR UNIFORM HEIGHTS

BACKGROUND OF THE INVENTION

1. Field of the Invention

The present invention relates to a method for fabricating a semiconductor device produced by mounting semiconductor elements on a printed circuit board.

2. Description of Prior Art

In recent years, the trends of application for semiconductors with a relatively large number of pins, such as a MPU, have been in the direction of a narrower pitch arrangement of electrodes, two-dimension lattice array of electrodes, or front arrangement of pin electrodes. Semiconductor devices with highly densified multi-pins are therefore coming on so that the electrodes can be formed close to or over the functional portions of elements. For conventional methods for mounting semiconductor elements on a printed circuit board using a flip chip technique, a method is known in which solder bumps are formed on the electrode faces of the semiconductor elements, as described in Japanese Patent Publication JP-A 53-87596. These solder bumps, which are composed of a solder alloy, are connected to the electrode pads on a circuit board by soldering. There are also known methods in which gold-stud bumps are formed on the electrode faces of a semiconductor and these bumps are connected to substrate electrode pads using a conductive adhesive (see Japanese Patent Publication JP-A 62-140264) or using a solder alloy (see Japanese Patent Publication JP-A 6-213615).

In these technologies of forming the bumps on the electrodes of a semiconductor, the substrate on which the semiconductors are mounted, requires the same flatness as a semiconductor chip. Proposal has been made of a method of forming the bump electrodes on a substrate side but the chip (see Japanese Patent Publication JP-A 4-19766). In general, ceramic substrates do not have such a flatness in its surface as semiconductor chips. This imparts the problem that a stable connection to electrode pads of the semiconductor cannot be made since all the tips of the bumps have no coplanarity even if the bumps with the same height are formed on the surface of the substrate.

Furthermore, there are methods in which an anisotropic conductive film is used to bind a semiconductor element to a substrate by hot pressing. In this bonding method, dielectric breakdown in the anisotropic conductive film is caused only at the position between the bump electrode and the electrode pad to electrically connect both of them. In this bonding method, the tips of the bump electrodes on the side of the substrate are also uneven. As there is a difference in intervals between each of the bump electrodes embedded into the adhesive film and the corresponding electrode pad of the semiconductor element, the bump electrodes having a wider gap between their tips and the corresponding electrode pads are not allowed to make electrical contact with the corresponding pads even if the semiconductor element is pressed against the substrate. It is uncertain to secure the electrical contact between all bump electrodes and the corresponding electrode pads.

SUMMARY OF THE INVENTION

In view of this situation, an object of the present invention is to provide a method for fabricating a semiconductor device to enable projection electrodes on a substrate to be formed in a manner that the bump electrodes can establish good and stable electrical contact with electrodes of a semiconductor element. The above object can be attained by the following inventions:

According to a first aspect of the present invention, there is provided a method for fabricating a semiconductor device, generally comprising; disposing electrode faces on the backface of a semiconductor element; forming a plurality of bump electrodes disposed on and projecting from the surface of a multilayer circuit substrate; and securing the semiconductor element to the multilayer circuit substrate using a contractive insulating resin layer, the method being characterized in that conductive resin adhesives applied on the bump electrodes are leveled to form end portions on the same flat plane, causing the end portions of the adhesive on the bumps to contact with all the corresponding electrode faces and to be bonded to the electrode faces by the conductive adhesive.

In the invention, the electrode pad faces of the semiconductor elements have so high flatness that adhesion between each electrode face and the corresponding end portion of each of the bump electrodes is secured thereby establishing good and stable electrical contact by forming each end on the plurality of bump electrodes on the substrate lying in a plane by using a conductive adhesive.

In the method for fabricating a semiconductor device according to the present invention, particularly, a conductive resin adhesive is applied on the top of each bump electrode to form end portions, the end portions on all bump electrodes are leveled to a uniform height and the end portions are brought into contact with the electrode faces and bonded to the electrode faces via the conductive adhesive.

Particularly, in the invention, an anisotropic conductive film may be used instead of the contractive insulating resin layer to bond the above semiconductor element to the multilayer circuit substrate. The anisotropic conductive film is produced by coating a great number of conductive particles with the resin to form insulating coating particles, which are dispersed in the film. As the anisotropic conductive film is locally pressed across the surfaces, in the locally pressed parts the insulating coating over the conductive particles is broken and the conductive particles are brought into contact each other allowing only the local pressed part to electrically conduct. In the invention, a great number of bump electrodes are embedded into the anisotropic conductive film and each end portion on these bump electrodes is adjacent to each of the electrode pad faces in the anisotropic conductive film and is held in electric conduction. Since each end portion is formed to a uniform height, all end portions have an accurate gap with each corresponding electrode pad face. Both corresponding electrodes are thereby held in electric conduction.

According to a further aspect of the present invention, there is provided a method for fabricating a semiconductor device comprising applying a conductive resin adhesive on each bump electrode to form an end portion of the adhesive on the bump electrode; leveling all the end portions of the adhesive on the bump electrodes to a uniform height; then applying an anisotropic conductive film on the surface of the multilayer circuit substrate so as to embed the bump electrodes; and pressing the semiconductor element to the multilayer circuit substrate so that the electrode faces accord with the end portions of the bump electrodes to bond the end portions of the bump electrodes with the corresponding electrode faces, followed by curing the conductive film.

BRIEF DESCRIPTION OF THE DRAWINGS

In the accompanying drawings, there are shown illustrative embodiments of the invention from which these and others of its objectives, novel features, and advantages will be readily apparent.

In the drawings.

DETAILED DESCRIPTION OF THE PREFERRED EMBODIMENTS

Figure 1A:
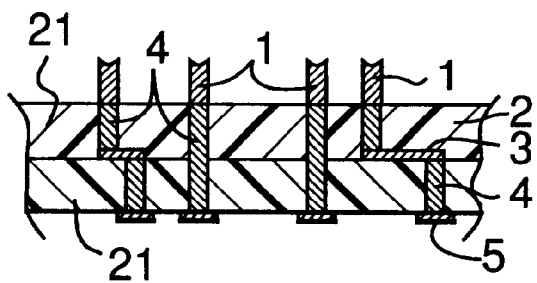
FIGS. 1A to 1E are partially cross-sectional views for illustrating steps of producing a semiconductor device using a conductive adhesive and a sealing resin according to an embodiment of the present invention.

A semiconductor device produced by a fabricating method according to the present invention will now be explained in detail. As shown in FIG. 1E, electrodes 8 are arrayed on the backface of a semiconductor 7. A multilayer circuit substrate 2 is provided with a great number of bump electrodes projecting from the surface. The bump electrode 1 is electrically connected to the corresponding circuit pattern electrode 3, 5 formed on the backface or inside of the substrate 2.

In the semiconductor device of the present invention, the semiconductor 7 is packaged to a multilayer circuit substrate 2 through an insulating resin 9 with which a clearance between them is filled, in which the electrode faces of the semiconductor element 7 is bonded to the bump electrodes 1 of the multilayer circuit substrate In the present invention, the multilayer circuit substrate 2 comprises two or more insulating layers 21 which are integrated with each another and circuit patterns 3 and 5 which are formed between the insulating layers or on the backface. As for materials used for the insulating layer, i.e. for the multilayer circuit substrate, no special flatness is required of the multilayer circuit substrate. Therefore, the insulating layer 21 and the substrate 2 may be formed from a ceramics (including glass) or a synthetic resin. Such a ceramics includes alumina, aluminum nitrate, and the like. As the synthetic resin for the insulating layer, for example, an epoxy resin or particularly an aramide fiber reinforced epoxy resin may be used. The multilayer substrate is produced by laminating and integrating the insulating layers of these ceramics and/or a synthetic resin.

The bump electrodes 1 are connected to the via hole conductors 4 passing through an outer insulating layer 21 of the substrate 2 and projects externally from the surface. The via hole conductors 4 are formed of a conductive paste cured with which via holes penetrated across the layer are filled. The via hole conductors 4 are connected to the circuit pattern electrode 3, 5 within or outside the above substrate.

The conductive resin adhesive 6 applied to the top of the bump electrode 1 is a paste consisting of a conductive filler and a thermosetting resin. Preferable examples of the conductive filler include as a major component, particles of a noble metal such as gold, silver, copper, and platinum. Besides the above metals, particles of aluminum, nickel, or the like may be used for the filler. As the thermosetting resin, for example, a phenolic resin or the like may be used.

The end portions on the bump electrodes are formed by applying a paste of the conductive adhesive which is prepared by kneading the conductive filler and the thermosetting resin, to the tips of the bump electrodes. In the present invention, each and every end portion is formed with an end face by leveling the portions on all bump electrodes after the paste is semi-cured. Even if there are camber and bank of the substrate and also the tops of the bump electrode are uneven in height, all end faces of the adhesive paste on the bump electrodes can accurately abut the corresponding electrodes of the semiconductor element.

In such a substrate, the tops of the bump electrodes 1 are bonded to the electrodes 8 of the semiconductor element 7 through the end portions of thick film of the conductive adhesive 6. In this condition, the semiconductor element 7 and the multilayer circuit substrate 2 are secured by the contractive insulating resin layer 9 with which the clearance between the semiconductor element 7 and the multilayer circuit substrate 2 is filled. A semiconductor device is thus produced. The reason why the insulating resin layer 9 is contractive is that when the insulating resin layer 9 is cured after the clearance between the semiconductor element and the multilayer circuit substrate is filled with the insulating resin layer 9, the insulating resin layer 9 shrinks in the vertical direction. This shrinkage causes the semiconductor element 7 and the multilayer circuit substrate 2 to be drawn inward; consequently, a compressive stress remains between the end portion of the bump electrode and the electrode face of the semiconductor element to strengthen the connection of them both.

As such a contractive insulating resin, an epoxy-phenolic or epoxy-acid anhydride resin may be used.

Figure 1B:
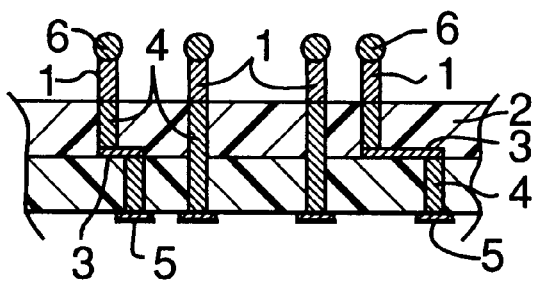
Figure 2A:
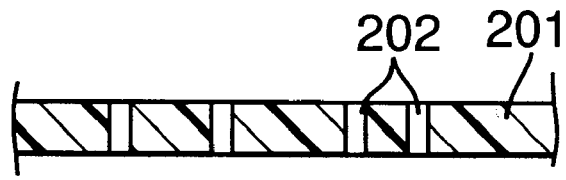
FIGS. 2A and 2E are partially cross-sectional views for illustrating steps of producing a resin multilayer semiconductor device having a bump electrode in another embodiment of the present invention.
Figure 2B:
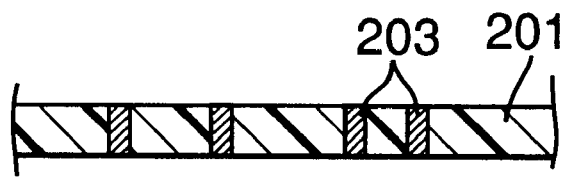

Next, in the method of fabricating a semiconductor device of the present invention, as shown in FIGS. 1A and 2B, first a paste-like conductive adhesive 6 is applied to the tops of the bump electrodes 1 to form end portions. In this step, the end portion 6 of the paste is shaped in a particulate, spherical, or other appropriate form and is semi-cured into a B-staged state on the top of the bump electrode.

Figure 1C:
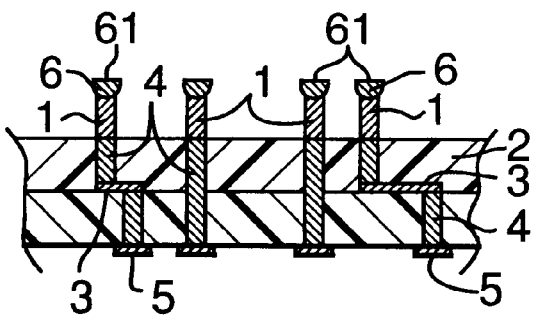

In the next step, as shown in FIG. 1C, the end portions made of the conductive adhesive 6 are leveled to a uniform height so that they have a good coplanarity. In this leveling step, preferably the B-staged end portions of the bump electrodes are pressed against a flat plate. Leveled end faces are thus formed on all the end portions. In general, these end portions are perfectly cured to fix the shape thereof.

Figure 1D:
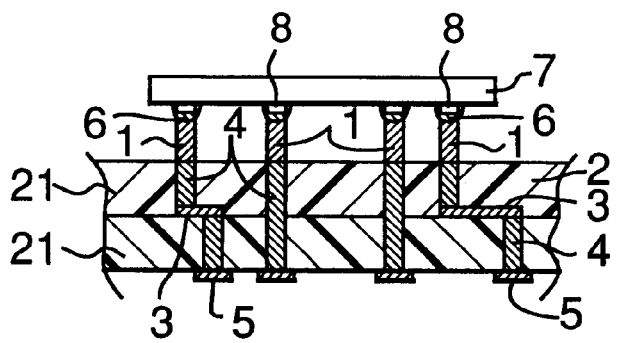
Figure 1E:
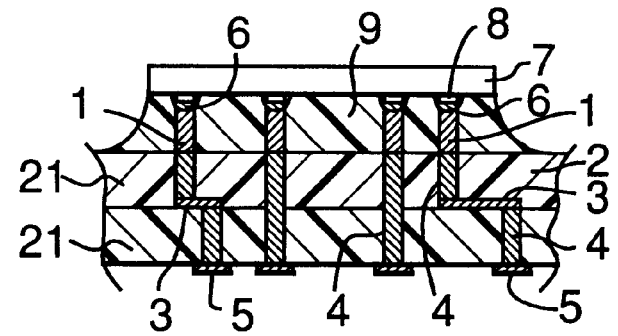

In the next step, as shown in FIG. 1D, the bump electrodes 1 of the multilayer circuit substrate 2 are connected to the electrode faces 8 of the semiconductor element 7 via the conductive adhesive 6 applied to the end portion. In the successive step, as shown in FIG. 1E, the clearance between the semiconductor element 7 and the multilayer circuit substrate 2 is filled with the contractive insulating resin 9 and then the contractive insulating resin 9 is cured. Thus, the semiconductor element is secured to the multilayer circuit substrate through these steps to produce a semiconductor device.

The method of the present invention preferably comprises an additional step of coating the electrode faces of the semiconductor element with a non-oxidizing metal. This step more ensures strong connection between the end portion of the bump electrode and the electrode face of the semiconductor element.

EXAMPLES

The present invention will be explained in more detail by way of examples, which are not intended to be limiting of the present invention.

Example 1

Example 1 will be explained with reference to FIGS. 1A to 1E. FIG. 1A shows a portional view of a circuit substrate 2 in the production of the ceramics multilayer circuit substrate 2 having bump electrodes 1. First, a glass ceramics (Trademark: MLS-1000, manufactured by Nippon Electric Glass Co., Ltd.) with a thickness of 0.2 mm was used as a substrate insulating layer 21. The green sheet was processed to penetrate many via holes (a diameter of 0.15 mm each), which were then filled with a via hole conductor paste containing silver as a major component. A conductor pattern was formed by printing to form a wiring pattern 3 and via hole conductors 4 as shown in the figure.

Bump electrodes were formed on the ceramics multilayer substrate 2 in a manner as described below. After a plurality of required green sheets, in which via holes and a conductive pattern are formed, are laminated in the same manner as above, the via holes being filled with a conductive paste, green sheets (thickness: 0.1 mm) of alumina (Trademark: ALM41, manufactured by Sumitomo Chemical Co., ltd.) were further laminated on the surface and backface of the glass ceramics green sheet laminated body respectively. An alumina green sheet applied on one surface was processed to form the via holes as required (a diameter of 0.15 mm) in desired positions in the same manner as in the glass ceramics green sheet. The via holes were filled with a conductive paste. In this case, though the diameter of the hole formed in the alumina green sheet is the same as that of the via hole formed in the glass ceramics green sheet, it is desirable that the diameter of the hole of the alumina green sheet be smaller.

These laminated green sheets were bonded to and integrated with each other at 80° C. under 150 kg/cm$^2$ by hot pressing. The united laminated body was fired at 850° C. At this temperature, the sintering of the glass ceramics particles proceeded but the alumina particles could not be sintered. The conductive paste embedded into the alumina green sheet was fired and bonded to the via hole conductors formed in the green sheet.

When the fired lamination was soaked in a water bath to perform ultrasonic cleaning, only the alumina layer was peeled off the laminate and bump electrodes were formed. The ceramics multilayer circuit substrate 2 having the bump electrode 1 was thus formed (FIG. 1A).

Next, as shown in FIG. 1B, the conductive adhesive 6 was applied to the tops of the bump electrode 1. In order to perform this application, a conductive adhesive paste layer was applied to a plate (not shown). The above substrate was located so that the bump electrodes 1 were allowed to oppose the plate and the plate was allowed to approach to the substrate 2 apply the conductive adhesive to the bump electrodes. The applied adhesive was semi-cured by heating to 80° C. to form the B-staged end portions 6.

The substrate 2 was pressed between a base plate (not shown) and a flat plate with a plane free from waves, cambers and banks in a manner that the above bump electrodes 1 are directed to the plate to level the above B-staged conductive adhesive 6 applied to the top of the bump electrodes 1 to form end faces 61 of a uniform height as shown in FIG. 1C.

Next, as shown in FIG. 1D, the semiconductor element 7 provided with electrode faces 8 coated with gold was prepared. The end portions 61 of the conductive adhesive 6 applied to the bump electrodes 1 on the substrate was connected to the electrode 8 of the semiconductor element. The conductive adhesive 6 was perfectly cured at 120° C. for 30 minutes to bond the bump electrode to the electrode 8.

In this connection, a conductive adhesive paste may be transferred to the end face 61 of the B-staged adhesive.

Next, as shown by a view of FIG. 1E, the clearance between the semiconductor element 7 and the substrate 1 was filled with an epoxy-type insulating resin 9 (Trademark: Chip Coat 8420, manufactured by Namics Corporation) and the resin 9 was then cured to obtain a semiconductor device.

The resulting semiconductor device was subjected to a temperature cycle test (−55° C. to +125° C.) to examine the connecting condition between the semiconductor element 7 and the substrate 1 and high connectability resulted.

Example 2

FIGS. 2A and 2B illustrate a method for fabricating a synthetic resin multilayer substrate having bump electrodes according to the present invention. As shown in FIG. 2A, through-holes 202 (a diameter of 0.15 mm) are formed at the prescribed positions in a parting film 201 (Teflon film, a thickness of 0.1 mm). No particular limitations is imposed on materials used for the film insofar as it has a smooth surface and never been softened by heating for curing the multilayer circuit substrate. After this, as shown in FIG. 2B, the through-holes 202 were filled with a thermosetting conductive paste 203.

Figure 2C:
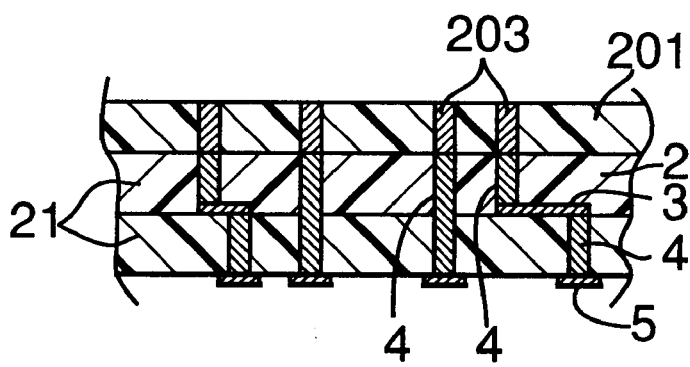
Figure 2D:
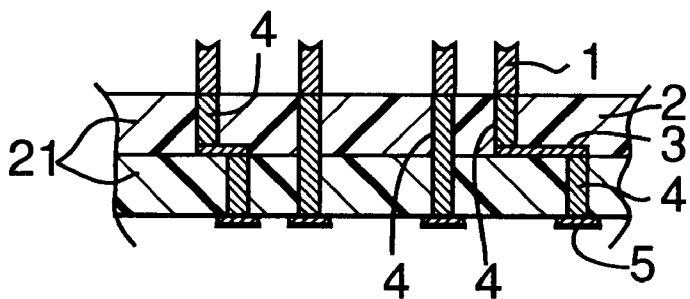

After the above step, as shown in FIG. 2C, the film 201 was aligned with an uncured resin multilayer circuit substrate 2 and then laminated. This uncured resin multilayer circuit substrate 2 was then completely cured by heating at 170° C. for 60 minutes. In succession, the film 201 was peeled off to produce bump electrodes 1 on the resin multilayer circuit substrate, which was connected to the via hole conductors 4 of the substrate and projects from the surface. As shown in FIG. 2D, a semiconductor device was obtained in the same steps as in Example 1. The resulting semiconductor device was subjected to a temperature cycle test (−55° C. to +125° C.) to examine the connecting condition between the semiconductor element and the substrate and high connectability resulted.

Example 3

Figure 3A:
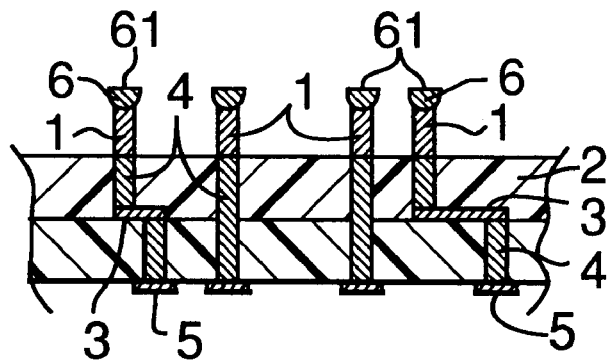
FIGS. 3A to 3C are partially cross-sectional views showing steps of producing a semiconductor device using an anisotropic conductive adhesive film in a further embodiment of the present invention.

A ceramics multilayer circuit substrate 2 having a great number of bump electrodes 1 on the surface thereof is produced in the same steps as in Example 1 as shown in FIG. 3A, wherein the height of each of end portions 6 of these bump electrodes 1 after a conductive adhesive is applied have a high coplanarity. As the multilayer circuit substrate, besides a ceramic substrate, a resin substrate or a complex substrate of a ceramics and a resin may be used.

Figure 3B:
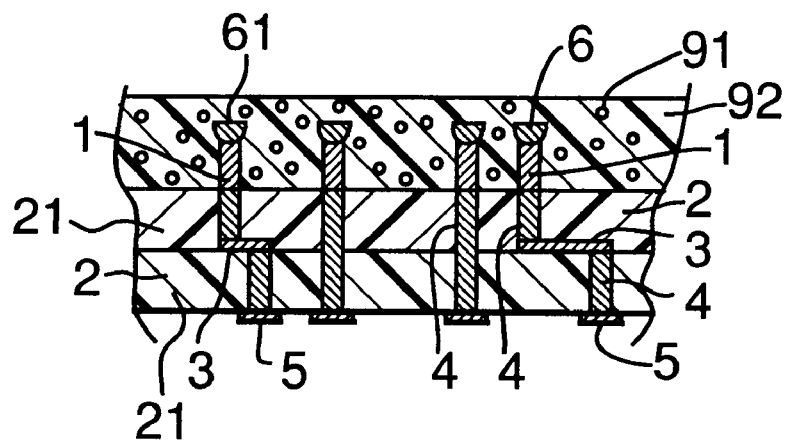
Figure 3C:
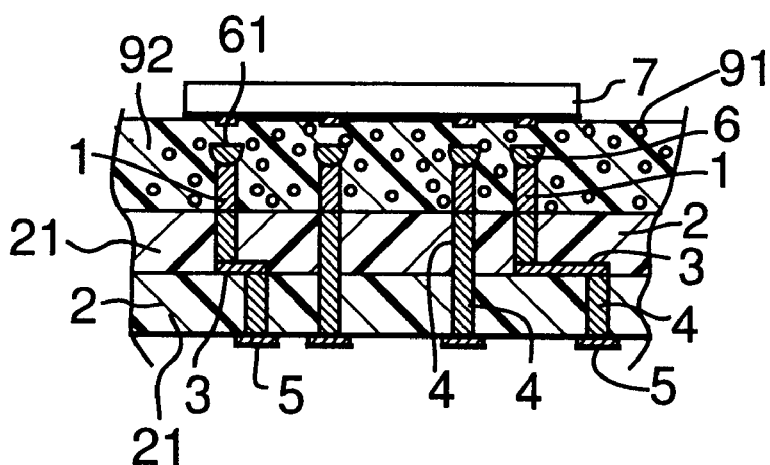

As shown in FIG. 3B, an anisotropic conductive film 92 (Trademark: Fliptuck, manufactured by Hitachi Chemical Co., Ltd.) was temporarily bonded to the surface of the multilayer circuit substrate in a manner that it covered the bump electrodes 1. A semiconductor element 7 provided with electrode faces 8 coated with gold was aligned with the multilayer circuit substrate 2. The semiconductor element 7 was brought into contact with the film 92 in a manner that the electrode faces 8 face the corresponding bump electrodes 1. Next, the substrate was heated under pressure at 180° C. for 20 seconds by hot press to cure the anisotropic conductive film 92. In condition, as shown in FIG. 3C, the electrode faces 8 and the faces of the end portion 61 on the bump electrodes were held in electric conduction since the both were in contact with each other via conductor particles 91 contained in the film 92 existing between the both. The resulting semiconductor device was subjected to a temperature cycle test (−55° C. to +125° C.) to examine the connecting condition between the semiconductor element and the substrate, and the result showed high connectability.

The semiconductor device and its fabrication method according to the present invention have the following advantages:

1. Uneven heights of the tops of bump electrodes caused by the waviness of a circuit substrate mounted with a semiconductor element can be eliminated by a level control of the conductive paste. Therefore, such a strict flatness is not required in the circuit substrate compared with a conventional connection method of using a conductive paste as the bump electrode.
2. The heights of bump electrodes are made even on a uniform height and hence a stress on a semiconductor element or circuit substrate is dispersed. Therefore, dynamic damages to a semiconductor device and circuit substrate decrease and hence potential of physical breaking at junctions reduces whereby the reliability of electrical connection is improved in comparison with a conventional connection method of using a conductive paste as the bump electrodes.

What is claimed is:

1. A method of fabricating a semiconductor device, wherein a number of bump electrodes have previously been formed on a surface of a multilayer circuit substrate for mounting a semiconductor element, bottoms of the bump electrodes being connected to via hole conductors buried in the multilayer circuit substrate, the method comprising:

applying a conductive adhesive to tops of the bump electrodes on the surface of the multilayer circuit substrate to form end portions of the conductive adhesive;

semi-curing the conductive adhesive into a B-staged state;

pressing the end portions of the conductive adhesive on the bump electrodes onto a flat surface to level the end portions of the conductive adhesive to a uniform height;

connecting electrodes of the semiconductor element to the end portions on top of the bump electrodes of the multilayer substrate and curing the conductive adhesive; and filling the clearance between the semiconductor element and the multilayer circuit substrate with a contractive insulating resin and curing the contractive insulating resin.

2. A method according to claim 1, wherein the electrode faces of the semiconductor element are coated with a noble metal.

3. A method according to claim 1, wherein said multilayer circuit substrate is one of a synthetic resin substrate, a ceramics substrate or a composite substrate comprising a synthetic resin and a ceramic.

4. A method for fabricating a semiconductor device, wherein a number of bump electrodes have previously been formed on a surface of a multilayer circuit substrate for mounting a semiconductor element, bottoms of the bump electrodes being connected to via hole conductors buried in the multilayer circuit substrate, the method comprising:

applying a conductive adhesive to tops of the bump electrodes on the surface of the multilayer circuit substrate to form end portions of the conductive adhesive;

semi-curing the conductive adhesive into a B-staged state;

pressing the end portions of the conductive adhesive on the bump electrodes onto a flat surface to level the end portions of the conductive adhesive to a uniform height;

applying an anisotropic conductive film on the surface of the multilayer substrate so as to embed the bump electrodes therein;

pressing a semiconductor element to the anisotropic conductive film such that the electrode faces of the semiconductor element coincide with the end portions on the tops of the bump electrodes; and curing the conductive film to connect the electrode faces to the end portions on the tops of the bump electrodes electrically through the conductive film.

5. A method according to claim 2, wherein the electrode faces of the semiconductor element are coated with a noble metal.

6. A method according to claim 2, wherein said multilayer circuit substrate is one of a synthetic resin substrate, a ceramic substrate or a composite substrate comprising a synthetic resin and a ceramic.

\* \* \* \* \*